United States Patent [19]
Aso

[11] Patent Number: 5,151,768
[45] Date of Patent: Sep. 29, 1992

[54] DIELECTRIC ISOLATION SUBSTRATE

[75] Inventor: Tsuyoshi Aso, Tokyo, Japan

[73] Assignee: Oki Electric Industry Co., Ltd., Tokyo, Japan

[21] Appl. No.: 845,785

[22] Filed: Mar. 6, 1992

Related U.S. Application Data

[63] Continuation of Ser. No. 657,823, Feb. 20, 1991, abandoned.

[30] Foreign Application Priority Data

Feb. 22, 1990 [JP] Japan ................................ 2-39786

[51] Int. Cl.⁵ ............................................ H01L 27/02
[52] U.S. Cl. ........................................ 357/51; 357/49; 357/50; 357/55
[58] Field of Search .................... 357/49, 50, 51, 55

[56] References Cited

U.S. PATENT DOCUMENTS 4,063,271  12/1977  Bean ....................................... 357/49
4,238,762  12/1980  McWilliams et al. ................. 357/49
4,866,501  9/1989  Shanefield ............................. 357/49

OTHER PUBLICATIONS

Japanese Laid-open Patent Application No. 294848/86, dated Dec. 25, 1986.

Primary Examiner—Edward J. Wojciechowicz
Attorney, Agent, or Firm—Wenderoth, Lind & Ponack

[57] ABSTRACT

A dielectric isolation substrate includes island-like regions made of a single crystal of semiconductor material and a supporting layer for supporting the island-like regions. The support layer is formed by first and second electrodes made of a conductive material and a dielectric film interposed therebetween to constitute a capacitor structure. The first electrode layer has a plurality of island-like regions on a principal surface side thereof remote from the dielectric film. The first electrode layer may be formed as one region for forming one capacitor or isolated two or more regions for forming two or more capacitors.

11 Claims, 5 Drawing Sheets

FIG_2

FIG._3

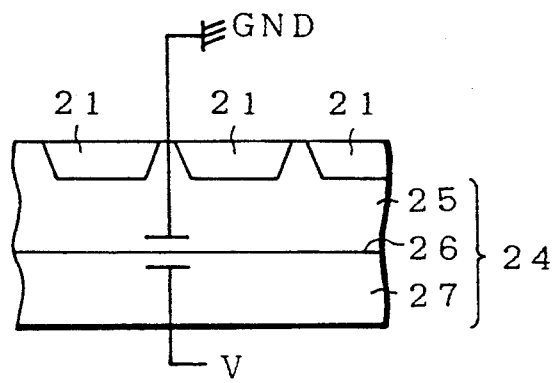
FIG_5 A
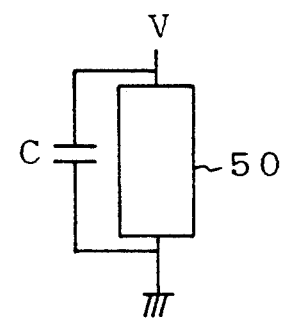
FIG_5 B
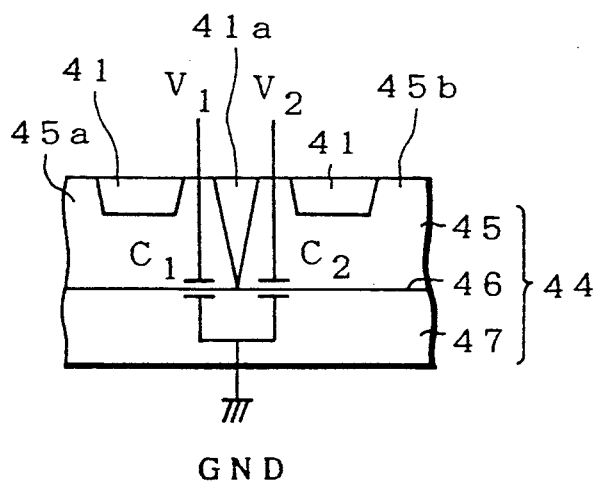
FIG_6 A
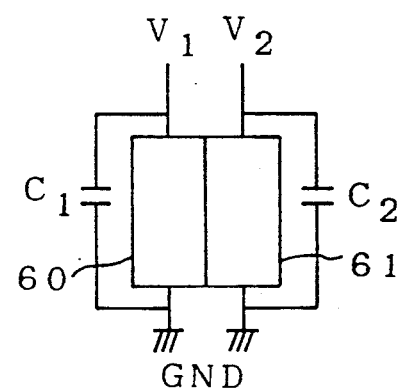
FIG_6 B

DIELECTRIC ISOLATION SUBSTRATE

This application is a continuation of now abandoned application Ser. No. 07/657,823, filed Feb. 20, 1991 now abandoned.

BACKGROUND OF THE INVENTION

1. Field of the Invention

The present invention relates to a dielectric isolation substrate containing a capacitor.

2. Description of the Conventional Technique

Dielectric isolation substrates containing semiconductor islands, isolation films and a support insulator(s) have been proposed, in which a smoothing capacitor(s) is formed in the dielectric isolation substrate to reduce variations in the power supply voltage A conventional example of a dielectric isolation substrate containing a capacitor is shown in FIG. 1. In this figure, the dielectric isolation substrate has a monocrystal silicon island(s) 1, the rear of which is covered with an isolation layer or film 2 formed of a dielectric film for insulating isolation. One single crystal silicon island forms a silicon island 1a used for forming a capacitor. In this Si-island 1a is formed a region 4 containing a conductive impurity at a high concentration, such as As, Sb or the like at an interface with the isolation film 2 and at an interface with a dielectric film 3 on the surface of the Si island. This high concentration region 4 is one of the capacitor electrodes, the electrode being connected to a wiring or interconnecting layer 6 through a contact hole 5 formed through a dielectric film 3 on the surface of the Si-island. The Si-island 1a is covered with a conductive polycrystalline silicon (polysilicon or poly-Si) layer 7 with the isolation film 2 in between them, the poly-Si layer 7 acting as another electrode for the capacitor. This electrode 7 is connected to another wiring (or interconnecting) layer 9 through a contact hole 8 on the dielectric film 3 on the surface of the Si-island, the wiring layer 9 also formed to extend to the surface of the Si-island 1a. The conductive poly-Si layer 7 is covered with another isolation film 10, and then the Si-island 1a, together with another Si-island 1 is supported integrally by a non-conductive poly-Si layer 11 on the rear side of the dielectric isolation substrate.

However, this conventional technique has a problem The Si-island(s) 1a for a capacitor occupies a large area in an upper surface of the substrate because of the necessity to enlarge the Si-island(s) 1a to increase a capacitance of the capacitor for the purpose of suppressing power supply variations sufficiently.

The present invention has been carried out for eliminating these conventional deficiencies.

Accordingly, an object of the present invention is to provide such a dielectric isolation substrate having formed therein a capacitor(s) that is capable of forming a capacitor of large capacitance without occupying a large area in an upper surface region of the substrate.

SUMMARY OF THE INVENTION

In accordance with an aspect of the present invention, the above-mentioned object has been achieved by providing a dielectric isolation substrate comprising island-like regions made of single crystal of semiconductor material; and a supporting layer for supporting the island-like regions; wherein the supporting layer is constructed in the form of capacitor by a first electrode layer made of conductive material, a dielectric film provided on one principal surface of the first electrode layer, and a second electrode layer made of conductive material, affixed or laminated on the dielectric film; wherein a number of individual island-like regions are respectively provided on the other principal surface side of the first electrode with an isolation film(s) therebetween.

With this structure, the supporting layer of the dielectric isolation substrate constitutes a capacitor by itself, and hence requires no specially dedicated region or area to form a capacitor in an upper surface region of the substrate. Accordingly, the island-like regions can be formed in high density, in which regions the required circuit components such as, for example, semiconductor elements and/or integrated circuits are formed. The ability to use all of the supporting layer as a capacitor forming region allows the construction of a high-capacitance capacitor.

In applying the present invention, each of the island-like regions has preferably a depth reaching a level midway in the thickness direction of the first electrode from the other principal surface thereof.

In a preferable embodiment of the present invention, each of the island-like regions has a depth reaching one principal surface from the other one of the first electrode layer.

It is preferable that, the first electrode layer may be separated or divided by an island-like region(s) into a plurality of sub-layers which are electrically isolated or separated from each other by the island-like region(s). The depth of these isolating island-like regions is preferably such that they reach from one of the principal surface of the first electrode layer to the other one. These isolating regions are preferably provided thereon with, for example, a wiring or interconnecting layer made of a conductive material, such as, for example, aluminum (Al).

In carrying out the present invention, it is preferable that the first electrode layer is made of conductive poly-Si.

In applying the present invention, it is preferable that the island-like region is a Si-region.

In applying the present invention, it is preferable that the dielectric film is made of thermally oxidized film.

In applying the present invention, it is preferable that the second electrode layer is a Si-substrate. This Si-substrate is affixed or laminated onto the dielectric film using a thermo-contact bonding technique.

In applying the present invention, the second electrode layer is preferably made of conductive poly-Si.

In applying the present invention, the first electrode layer or the second electrode layer is preferably connected to the point of grounding reference potential.

BRIEF DESCRIPTION OF THE DRAWINGS

The foregoing and other objects, features and advantages of the present invention will be better understood from the following description taken in connection with the accompanying drawings, in which:

FIGS. 5A and 5B are diagrams for explaining the connections of a capacitor(s) included in the structure of the embodiments shown in FIG. 2; and FIGS. 6A and 6B are diagrams for explaining the connections of a capacitor(s) included in the structure of the embodiments shown in FIGS. 3 and 4.

PREFERRED EMBODIMENTS OF THE INVENTION

Examples of a structure of a dielectric isolation substrate of the present invention will be described with reference to the drawings.

In the figures, the shapes and sizes of constituents as well as the positional relationships or arrangements therebetween are drawn schematically so as to facilitate the understanding of the present invention.

Figure 1:
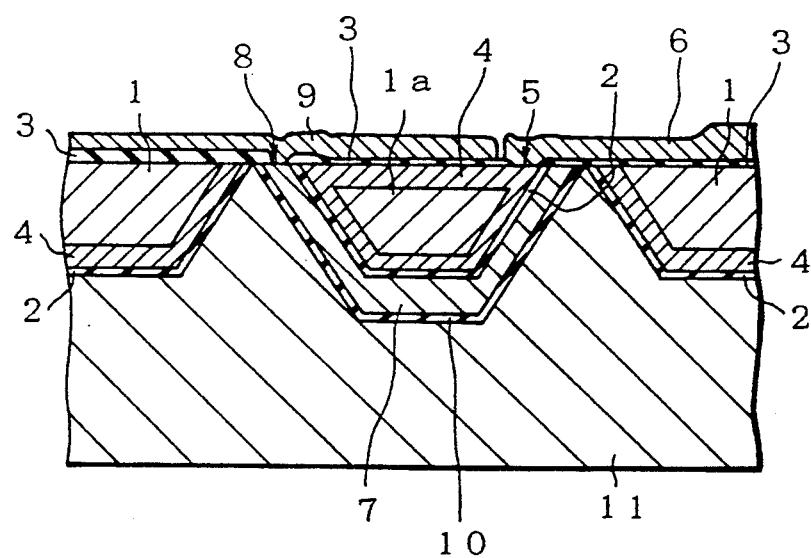
FIG. 1 is a partial cross section view schematically illustrating the conventional dielectric isolation substrate.
Figure 2:
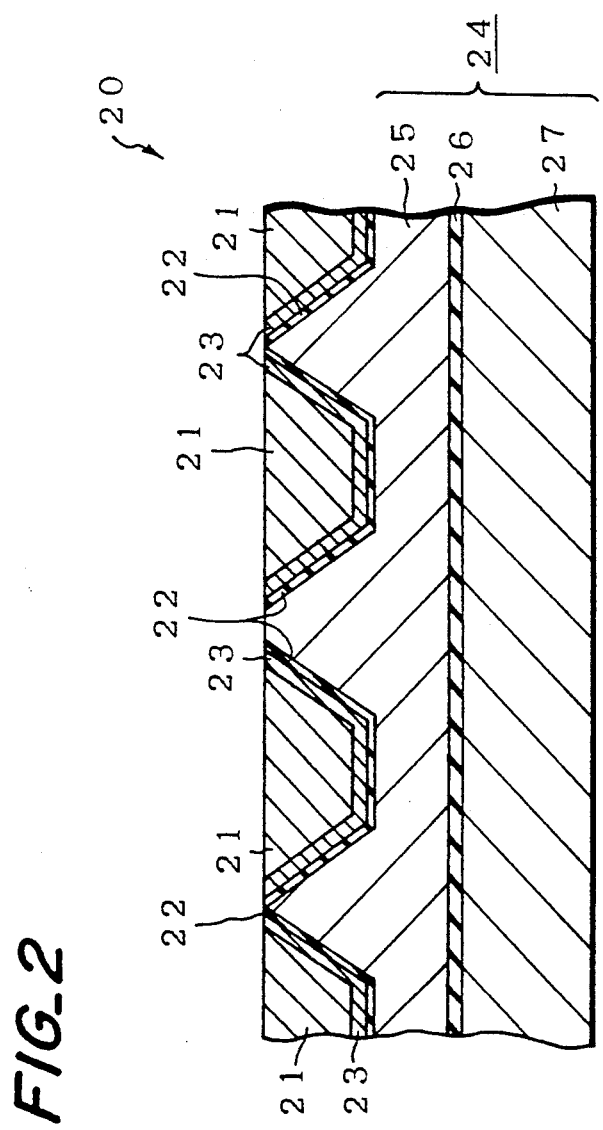
FIG. 2 is a partial cross section view schematically showing preferred embodiment of the structure of the dielectric isolation substrate according to the present invention.

FIG. 2 is a cross section view showing an initial embodiment In this embodiment, a dielectric isolation substrate 20 has a number of island-like regions 21, each of which is made of single crystal of semiconductor material, and a supporting layer 24 supporting these island-like regions 21. These island-like regions are preferably a number of Si-islands disposed apart from each other, with their rear side—excepting the top surfaces thereof—covered with an isolation or insulating film(s) 22. Between this isolation film 22 and the single crystal Si-island 21 is formed as an embedded or buried layer a boundary region 23 containing suitable conductive impurity such, for example, as As or Sb at high concentration These single crystal Si-islands 21 are integrally supported by the supporting layer 24 on such the rear side of the Si-island that is covered with the isolation film 22.

The supporting layer 24 consists of three layers, namely, a first layer 25, a second layer 27 and a dielectric film 26 interposed between first and second layers 25 and 27. The first layer 25 is a first electrode layer made of suitable conductive material provided on the side of the single crystal Si-island 21, the first layer 25 being preferably a conductive poly-Si layer The second layer 27 is a second electrode layer made of suitable conductive material, and affixed or laminated to the rear side of the first layer 25, with the dielectric film (dielectric film for the capacitor) 26 sandwiched between the layers 25 and 27, which is also called an affixed or laminated supporting element Thus, in this embodiment, a capacitor serving as a supporting layer 24 for each single crystal Si-island 21 is formed by the conductive poly-Si layer 25 as the first electrode, the dielectric film 26 formed on one principal surface of the conductive polysilicon layer 25, and the affixed supporting element 27 acting as the second electrode, provided on the dielectric film 26. Thus, because a capacitor can be formed beneath each island 21 if the capacitor is formed utilizing the supporting layer, then a capacitor of large capacitance, in which the electrode 27 being one of the two electrodes can be connected to the grounding reference potential point (GND), can be formed in the dielectric isolation substrate 20 without occupying a dedicated area(s) in the upper surface region of the substrate.

The above-mentioned single crystal Si-islands 21 are provided or disposed on the side of the other principal surface of the conductive polysilicon layer 25, respectively, with the isolation film 22 interposed between the Si-island 21 and the poly-Si layer 25. The island-like regions 21 are formed to a depth reaching part of the thickness of the first electrode layer 25 from its other principal surface.

FIGS. 5A and 5B are diagrams for explaining the capacitor formed in the dielectric isolation substrate 20 according to the first embodiment. In FIGS. 5A and 5B, reference character C shows the capacitor formed in the dielectric isolation substrate 20. In this embodiment, the surfaces between the single crystal Si-islands 21 among the surface regions of the conductive polysilicon layer 25, serving as the first electrode layer of the supporting layer 24, are connected to the grounding reference potential point (GND), through a suitable conductive layer(s) according to the design. A suitable part of the second electrode layer 27 is connected to a line leading to a power supply (V). In this embodiment, one capacitor C of large capacitance is formed, which is common to the plurality of the island-like regions 21 provided in one chip and formed with semiconductor elements and the like. Therefore, if a block 50 shown in FIG. 5B represents other circuits to be formed in one and the same chip as an internal circuit, the capacitor C will be connected in parallel to the internal circuit 50. Therefore, the capacitor C constitutes a voltage-stabilized circuit relative to the power supply (V).

Figure 3:
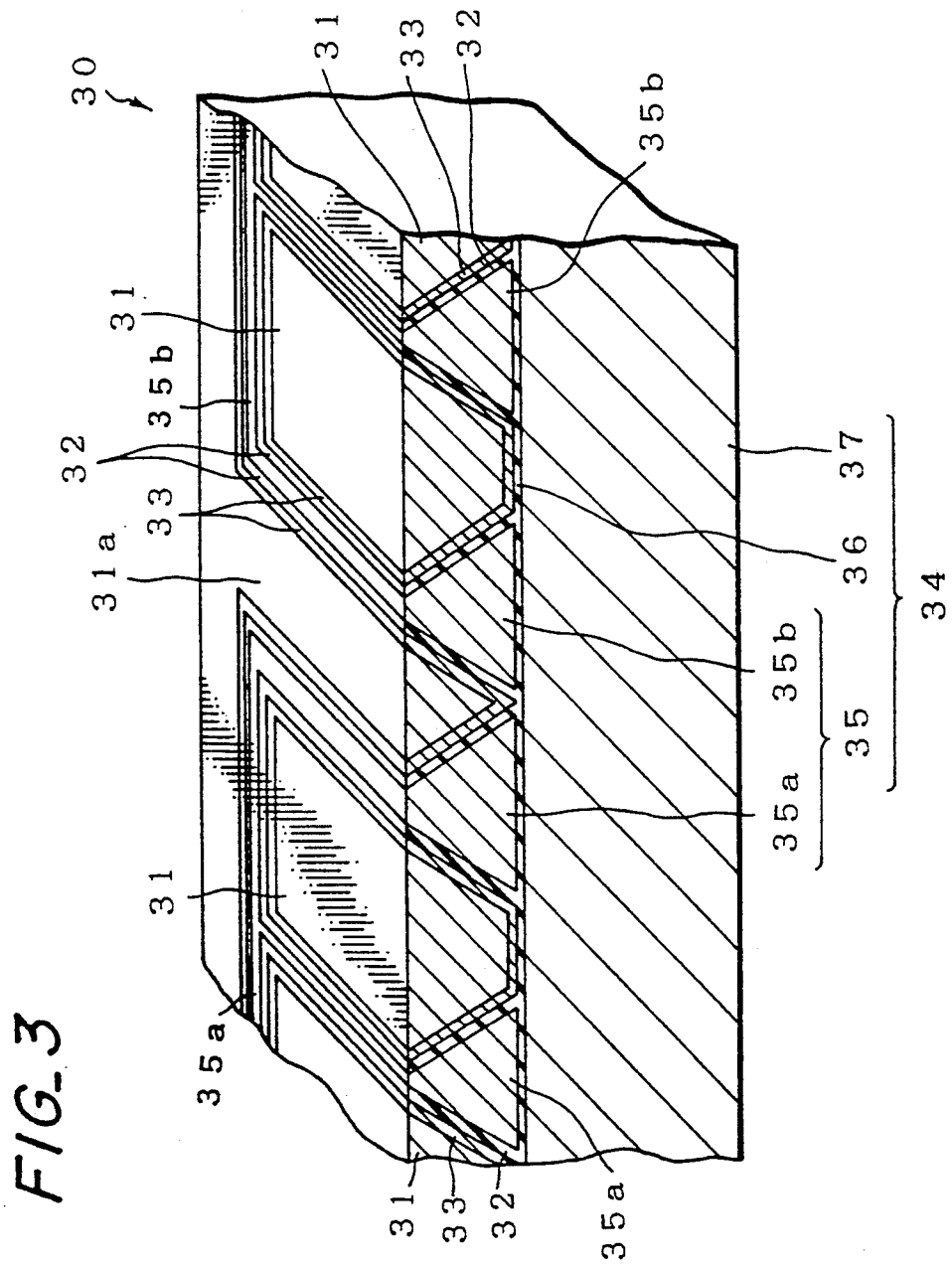
FIGS. 3 and 4 are partial perspective views, including partial cross sections, schematically showing preferred embodiments of the structure of the dielectric isolation substrate according to the present invention.

FIG. 3 shows a second embodiment of the present invention. The dielectric isolation substrate 30 according to the second embodiment has a structure such that the first electrode layer 35 of the supporting layer 34 is separated or divided into a plurality of sub-layers or layer portions 35a and 35b by an island-like region(s). The layer portions 35a and 35b are arranged so as to surround a respective single crystal Si-layers 31 and 31a. To attain the above-mentioned structure of the second embodiment, island-like regions 31 and 31a are disposed or formed to reach from principal surface principal surface to the other one of the first electrode layer 35. A metalization pattern is formed on a single crystal Si-region 31a for wiring or interconnection. In this structure, the depth of the single crystal Si-islands 31 and 31a is equivalent to the thickness of the conductive polysilicon layer 35 as the first electrode layer, and the bottom of the single crystal Si-islands 31 and 31a contacts with the dielectric film 36 for isolation The single crystal Si-island(s) 31a is used for isolating the conductive polysilicon layer to thereby separate or divide the conductive polysilicon layer 35 into a plurality of sub-layers, that is, electrode layer portions, or the first region 35a and the second region 35b, for example. A constituent 32 is an isolation film corresponding to the film 22 in FIG. 2, a constituent 33 is a boundary region corresponding to the boundary 23 in FIG. 2, a constituent 34 is a supporting layer corresponding to the layer 24 in FIG. 2, constituent 36 is a dielectric film for the capacitor corresponding to the film 26 in FIG. 2, and a constituent 37 is an affixed or laminated supporting element which makes up the second electrode layer corresponding to the electrode 27 in FIG. 2.

With the above structure, two capacitors (35a, 36, 37) and (35b, 36, 37) can be formed by using each of the first and second regions 35a and 35b of the conductive polysilicon layer 35 and using the attached conductive supporting element 37, while using the electrode 37 as the common ground electrodes (connected to the grounding reference potential point).

However, in the second embodiment, the conductive polysilicon layer is left only on the region sandwiched between sides of the Si-islands 31 and 31a, so that the surface area of the conductive polysilicon layer becomes smaller, thereby reducing the capacitance of the capacitor.

Figure 4:
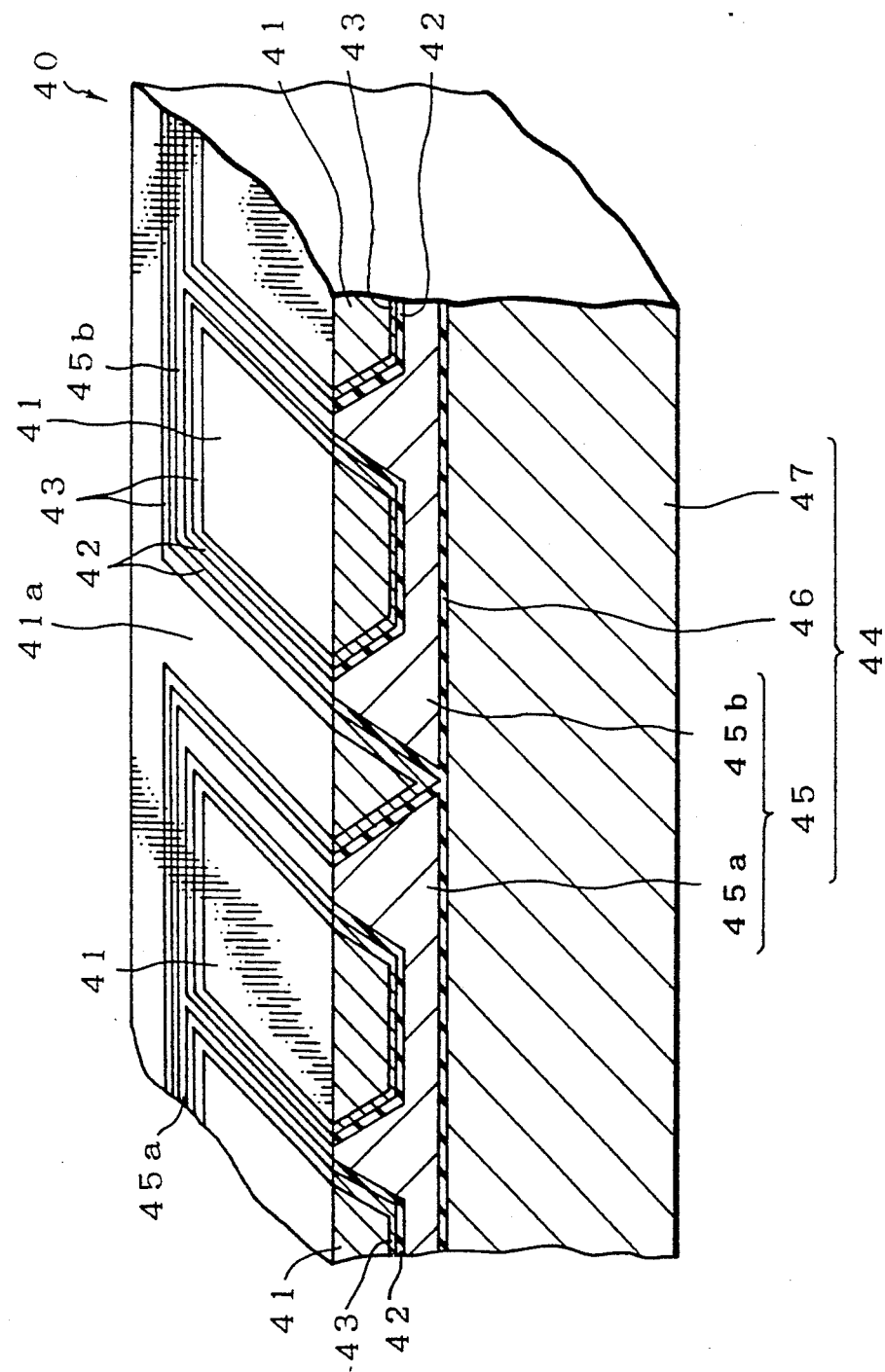

The dielectric isolation substrate 40 of a third embodiment in FIG. 4 is a variation of the second embodiment. In the third embodiment, a single crystal Si-island(s) 41a disposed on or formed in a first electrode layer 45, that is, a conductive polysilicon layer 45, is formed with a depth reaching one principal surface from the other one of the layer, and an island-like region(s) 41 has a depth reaching midway through the thickness of the conductive polysilicon layer 45 from the other principal surface. The conductive polysilicon layer 45 is separated or divided into a plurality of sublayers, that is, the first and second regions 45a and 45b, by isolating the single crystal Si-island(s) 41a, the bottom of which is contacting the dielectric film 46. On the one hand, the other single crystal Si-islands 41 has a shallower depth. Therefore, the region of the conductive polysilicon layer remains below the bottom of the islands and contact with the dielectric film 46 used for a capacitor. A constituent 42 is an isolation film corresponding to the film 32 in FIG. 3, a constituent 43 is a boundary region corresponding to the region 33 in FIG. 3, a constituent 44 is a supporting layer corresponding to the layer 34 in FIG. 3, and a constituent 47 is an affixed supporting element acting as the second electrode corresponding to the electrode 37 in FIG. 3. Therefore, in this embodiment are formed the first capacitor comprising the electrode of the first region 45a, dielectric film 46 and affixed supporting element 47, and the second capacitor comprising the electrode of the second region 45b, dielectric film 46 and affixed supporting element 47.

With such structures, the areas of the first and second regions 45a and 45b are increased because of the region of the conductive polysilicon layer 45 remaining below the bottom of the single crystal Si-islands 41. Therefore, the two capacitors can be made with increased capacitances.

The capacitors formed in the dielectric isolation substrate 40 according to the third embodiment are explained by referring to FIGS. 6A and 6B. In this embodiment, the first electrode layer 45 is electrically separated into two regions 45a and 45b by using the isolating single crystal Si-island(s) 41a. Therefore, the semiconductor single crystal island-like regions 41 provided partially on the regions 45a and 45b serving as the first electrode layer are also electrically independent from each other. This forms two capacitors ($C_1$ and $C_2$) in the dielectric isolation substrate 40 corresponding to regions 45a and 45b, as shown in FIG. 6A. Since the second electrode layer 47 and the dielectric film 46 are common relative to both of regions 45a and 45b, connection of the second electrode layer 47 to the grounding reference potential point (GND), connection of the first region 45a to a line of the first power supply $V_1$, and connection of the second region 45b to a lien of the second power supply $V_2$ can constitute voltage stabilized circuits using capacitors $C_1$ and $C_2$ which have large capacities relative to the two power supplies $V_1$ and $V_2$. While in this case more than two internal circuits 60 and 61 will be formed in one and same chip, capacitor $C_1$ is connected in parallel to the internal circuit 60 connected to the first power supply $V_1$, and capacitor $C_2$ is connected to the internal circuit 61 connected to the second power supply $V_2$, similarly to the case of FIG. 5B.

Also in the second embodiment, similar to the third embodiment, capacitors $C_1$ and $C_2$ are formed as shown in FIGS. 6A and 6B, respectively, whereas voltage stabilized circuits are constituted relative to the first and second power supplies $V_1$ and $V_2$.

In the second and third embodiments, the single crystal Si-islands 31a and 41a for isolating the conductive polysilicon layers are utilized as regions on which a wiring or interconnecting layer(s) is provided, and thus do not contribute to increasing the area of the dielectric isolation substrate.

In the above embodiments, thermally oxidized films may be used as the insulation-isolating dielectric films 26, 36 and 46. Further, silicon substrates may be used as the conductive supporting elements 27, 37 and 47. These silicon substrates can be affixed or laminated on surfaces of the polished dielectric films 26, 36 and 46 by using thermal contact bonding. Also, in place of conductive affixed supporting elements, conductive polysilicon layers may be formed as the second layer for the supporting elements 24, 34 and 44.

While the above embodiments were explained as making a supporting layers 24, 34 and 44 as a three-layer structure, using four or more layer structure will yield capacitors with larger capacitances.

As described above in detail, according to the dielectric isolation substrate of the present invention, in which a capacitor can be formed in such a manner as to serve as a supporting element layer, a large-capacity capacitor can be formed without occupying a dedicated area in the upper surface of a substrate. The invention also has the effect of forming a number of capacitors utilizing the supporting layers by dividing the first layer on the side of the single crystal semiconductor island among multi-layered supporting layers by using single crystal semiconductor islands.

What is claimed is:

1. A dielectric isolation substrate comprising:
   a plurality of single crystal semiconductor islands having surfaces substantially lying in a common plane;
   a plurality of first insulating layers respectively underlying said semiconductor islands, said semiconductor islands being electrically isolated from each other by said first insulating layers; and
   a supporting structure having a capacitor therein, said supporting structure including,
   (a) a first conductive layer supporting and electrically isolated from said semiconductor islands, the first conductive layer having a first surface and an opposite second surface, the first surface having a flat region substantially lying in the common plane and a concave region underlying said first insulating layers, the first conductive layer constituting a first electrode of the capacitor and being electrically connected to a first potential,
   (b) a second insulating layer having a first surface and an opposite second surface, the first surface of the second insulating layer formed on the second surface of the first conductive layer, the second insulating layer constituting a dielectric layer of the capacitor, and
   (c) a second conductive layer formed on the second surface of the second insulating layer, the second conductive layer constituting a second electrode of the capacitor and being electrically connected to a second potential.

2. A dielectric isolation substrate according to claim 1, wherein the first potential is a ground reference potential.

3. A dielectric isolation substrate according to claim 1, wherein the second potential is a power supply voltage potential.

4. A dielectric isolation substrate according to claim 1, wherein each semiconductor islands includes a buried conductive layer located on a respective first insulating layers.

5. A dielectric isolation substrate according to claim 4, wherein the buried conductive layer is an impurity introduced layer having a high concentration.

6. A dielectric isolation substrate comprising:
a plurality of first single crystal semiconductor islands having surfaces substantially lying in a first common horizontal plane;
a second single crystal semiconductor island having a surface substantially lying in the first common horizontal plane;
a plurality of first insulating layers respectively underlying said first semiconductor islands, said first semiconductor islands being electrically isolated from each other by said first insulating layers;
a second insulating layer underlying said second semiconductor island and contacting a second common horizontal plane; and
a supporting structure having a first and a second capacitor therein, said supporting structure including,
(a) a first conductive layer supporting and electrically isolated from said first semiconductor islands, the first conductive layer being divided by said second insulating layer into two sub-layers extending side-by-side in a horizontal direction, each of the two sub-layers having a first surface and an opposite second surface, each first surface of the two sub-layers having a flat region substantially lying in the first common horizontal plane and a concave region underlying said first insulating layers, each second surface of the two sub-layers substantially lying in the second common horizontal plane, each of the two sub-layers constituting first electrodes of the first and second capacitors and being electrically connected to first and second potentials respectively,
(b) a third insulating layer having a first surface and an opposite second surface, the first surface of the third insulating layer formed on each second surface of the two sub-layers and extending substantially in the second common horizontal plane, the third insulating layer constituting dielectric layers of the first and second capacitors, and
(c) a second conductive layer formed on the second surface of the third insulating layer, the second conductive layer constituting a common second electrode of the first and second capacitors and being electrically connected to a third potential.

7. A dielectric isolation substrate according to claim 6, wherein the third potential is a ground reference potential.

8. A dielectric isolation substrate according to claim 6, wherein the first potential is a first power supply voltage potential and the second potential is a second power supply voltage potential.

9. A dielectric isolation substrate according to claim 8, wherein the first power supply voltage potential is different from the second power supply voltage potential.

10. A dielectric isolation substrate according to claim 6, wherein each first semiconductor island includes a buried conductive layer located on a respective first insulating layer.

11. A dielectric isolation substrate according to claim 10, wherein the buried conductive layer is an impurity introduced layer having a high concentration.

* * * * *